United States Patent
Naito et al.

(10) Patent No.: US 10,483,104 B2
(45) Date of Patent: Nov. 19, 2019

(54) METHOD FOR PRODUCING STACKED ELECTRODE AND METHOD FOR PRODUCING PHOTOELECTRIC CONVERSION DEVICE

(71) Applicant: KABUSHIKI KAISHA TOSHIBA, Minato-ku, Tokyo (JP)

(72) Inventors: Katsuyuki Naito, Tokyo (JP); Eishi Tsutsumi, Kanagawa (JP); Norihiro Yoshinaga, Kanagawa (JP); Yoshihiro Akasaka, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 681 days.

(21) Appl. No.: 14/874,569

(22) Filed: Oct. 5, 2015

(65) Prior Publication Data
US 2016/0027935 A1 Jan. 28, 2016

Related U.S. Application Data

(63) Continuation-in-part of application No. 13/771,717, filed on Feb. 20, 2013, now abandoned.

(30) Foreign Application Priority Data

Mar. 30, 2012 (JP) ................. 2012-081927

(51) Int. Cl.
 *H01L 21/02* (2006.01)
 *H01L 29/41* (2006.01)
 (Continued)

(52) U.S. Cl.
 CPC ........ *H01L 21/02603* (2013.01); *C23C 16/06* (2013.01); *C23C 16/26* (2013.01); *H01L 29/413* (2013.01); *H01L 31/1884* (2013.01)

(58) Field of Classification Search
 CPC ............... H01L 31/0224; H01L 29/413; H01L 21/02603
 See application file for complete search history.

(56) References Cited

U.S. PATENT DOCUMENTS

2008/0259262 A1 10/2008 Jones et al.
2008/0266642 A1* 10/2008 Burrell .................... B60R 1/088
 359/270
(Continued)

FOREIGN PATENT DOCUMENTS

JP 2007-157372 6/2007
JP 2010-525526 7/2010

OTHER PUBLICATIONS

Jeong et al, Prospects for Nanowire-Doped Polycrystalline Graphene Films for Ultratransparent, Highly Conductive Electrodes, Nano Letters, vol. 11, 2011, pp. 5020-5025.
(Continued)

*Primary Examiner* — Jose R Diaz
(74) *Attorney, Agent, or Firm* — Amin, Turocy & Watson LLP

(57) ABSTRACT

A method for producing a stacked electrode of an embodiment includes preparing a multi-layered graphene film, applying a dispersion liquid of metal nanowires onto the multi-layered graphene film, and removing a solvent from the dispersion liquid to prepare a metal wiring on the multi-layered graphene film.

21 Claims, 9 Drawing Sheets

(51) Int. Cl.
 *H01L 31/18* (2006.01)
 *C23C 16/06* (2006.01)
 *C23C 16/26* (2006.01)

(56) References Cited

U.S. PATENT DOCUMENTS

| | | | |
|---|---|---|---|
| 2008/0286447 A1* | 11/2008 | Alden | B82Y 30/00 427/108 |
| 2009/0146111 A1* | 6/2009 | Shin | B82Y 30/00 252/510 |
| 2011/0048625 A1* | 3/2011 | Caldwell | B82Y 30/00 156/233 |
| 2012/0068122 A1* | 3/2012 | Kranbuehl | B82Y 30/00 252/503 |
| 2012/0098028 A1 | 4/2012 | Naito | |
| 2012/0121891 A1* | 5/2012 | Kim | B82Y 10/00 428/323 |
| 2012/0241796 A1 | 9/2012 | Naito | |
| 2013/0078436 A1 | 3/2013 | Naito et al. | |
| 2013/0078449 A1 | 3/2013 | Naito et al. | |
| 2013/0081678 A1 | 4/2013 | Naito et al. | |
| 2013/0153860 A1* | 6/2013 | Kim | H01L 51/0002 257/14 |
| 2014/0014171 A1* | 1/2014 | Alam | G02F 1/13439 136/256 |

OTHER PUBLICATIONS

Zhu et al, Rational Design of Hybrid Graphene Films for High-Performance Transparent Electrodes, ACS Nano, vol. 5, No. 8, 2011, pp. 6472-6479.
Office Action of Notification of Reason(s) for Refusal for Japanese Patent Application No. 2012-081927 dated Jul. 29, 2014, 5 pgs.
Office Action of Decision of Refusal for Japanese Patent Application No. 2012-081927 dated Mar. 31, 2015, 4 pages.
Non-Final Office Action for U.S. Appl. No. 13/771,717 dated Jun. 19, 2015, 24 pages.
William S. Hummers, et al. "Preparation of Graphitic Oxide", Journal of the American Chemical Society, Mar. 20, 1958, p. 1339.

\* cited by examiner

METHOD FOR PRODUCING STACKED ELECTRODE AND METHOD FOR PRODUCING PHOTOELECTRIC CONVERSION DEVICE

CROSS-REFERENCE TO RELATED APPLICATION

This is a Continuation-in-Part application of U.S. patent application Ser. No. 13/771,717, filed Feb. 20, 2013, the entire contents of which are incorporated herein by reference.

This application is based upon and claims the benefit of priority from Japanese Patent Applications No. 2012-081927, filed on Mar. 30, 2012; the entire contents of which are incorporated herein by reference.

FIELD

Embodiments described herein relate generally to a method for producing a stacked electrode and a method for producing a photoelectric conversion device.

BACKGROUND

Various developments have been made on conductors containing carbon materials (such as carbon fibers, carbon nanotubes, and graphenes) and electrical devices using the conductors including photoelectric conversion devices (such as solar cells, organic EL devices, and optical sensors).

The carbon material can be used to greatly reduce the usage of a rare metal or the like. The carbon material is excellent in flexibility, mechanical strength, and chemical stability. The carbon material has a relatively high conductivity and exhibits a high resistance in intermolecular conduction. A large-area transparent electrode containing the carbon material has a higher electrical resistance as compared with those containing an indium tin oxide (ITO) film having the same light transmittance. In addition, the carbon material exhibits a higher electrical resistance in a long-distance electrical wire or the like as compared with conductive metal materials containing copper or the like. Therefore, composites of the carbon material and a particle or wire of a metal or semiconductor have been studied in view of improving the conductivity.

DETAILED DESCRIPTION

A method for producing a stacked electrode of an embodiment includes preparing a multi-layered graphene film, applying a dispersion liquid of metal nanowires onto the multi-layered graphene film, and removing a solvent from the dispersion liquid to prepare a metal wiring on the multi-layered graphene film.

A method for producing a photoelectric conversion device of an embodiment includes a method for producing the stacked electrode is the method for producing a stacked electrode includes preparing a multi-layered graphene film; applying a dispersion liquid of metal nanowires onto the multi-layered graphene film, and removing a solvent from the dispersion liquid to prepare a metal wiring on the multi-layered graphene film. The photoelectric conversion device includes as constituents, a stacked electrode, a counter electrode facing the stacked electrode, and a photoelectric conversion layer interposed between the stacked electrode and the counter electrode.

Embodiments of the invention will be described below with reference to the drawings.

Figure 1:
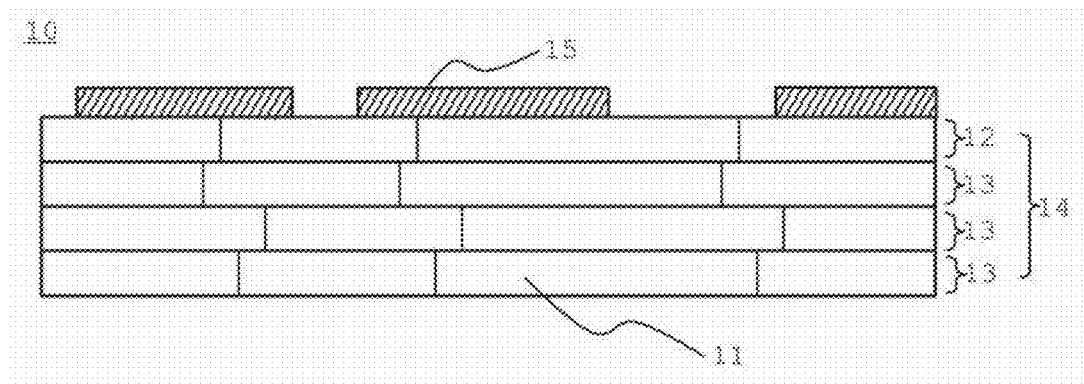
FIG. 1 is a conceptual cross-sectional view of a stacked electrode according to an embodiment.

As shown in the conceptual cross-sectional structure example view of FIG. 1, a stacked electrode 10 according to the embodiment has a multi-layered graphene film 14 and a metal wiring 15 formed thereon. A functional substrate of a photoelectric conversion device, a display device, or the like may be disposed below the stacked electrode 10.

The multi-layered graphene film 14 contains a laminate of graphene sheets 12 and 13, which each contain an aggregate of graphene plates 11. The uppermost graphene sheet 12 is in direct contact with the metal wiring 15, and the graphene sheets 13 disposed below the graphene sheet 12 are not indirect contact with the metal wiring 15.

The graphene plate 11 contains a high-crystallinity graphene and has a high electrical conductivity. When the graphene plate 11 is composed of a defect-free graphene, the graphene plate 11 has a conductivity of $10^6$ S/cm in the film plane direction. The graphene plate 11 may have a size of 0.001 to 100 $\mu m^2$.

Figure 2:
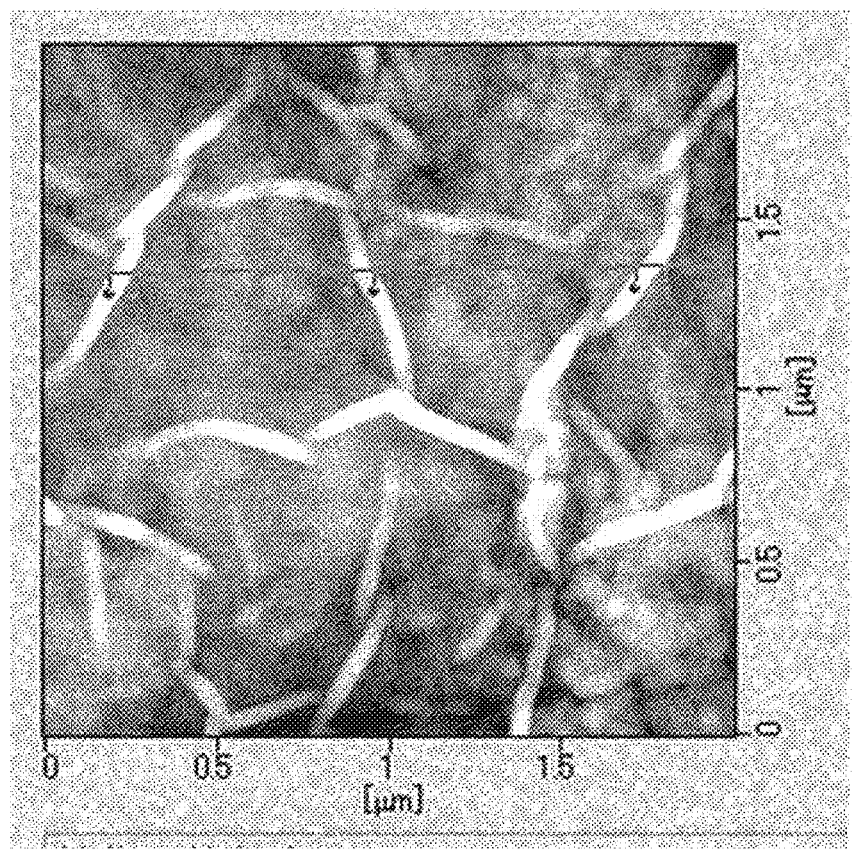
FIG. 2 is an AFM image of a graphene sheet according to the embodiment.

FIG. 2 is an AFM image example of the graphene sheet containing the aggregate of the graphene plates prepared from a graphene oxide. As is clear from FIG. 2, the graphene sheet contains the aggregate of the graphene plates 11, which each have a crystal grain boundary and a diameter of approximately 500 nm. In this example, some of the graphene plates 11 have a bent structure. The graphene plates 11 partially overlap with each other though the overlap cannot be observed in the shown surface. Even in a case where the graphene sheet is prepared by a CVD process, the resultant sheet contains the aggregate of the graphene plates 11 in the same manner as that prepared from the graphene oxide. The size and shape of the graphene plate 11 depend on the preparation conditions.

Though the conductivity of the graphene plate 11 may be lowered by a defect formed therein, the graphene plate 11 generally has an electrical conductivity sufficient for use in a transparent conductive film. Meanwhile, the graphene plates 11 exhibit a resistance in the conduction between each other. The graphene sheet prepared by the CVD process contains the aggregate of small graphene plates and has a conductivity of approximately $10^2$ to $10^4$ S/cm in the film plane direction. The graphene sheet prepared by reducing and heating the graphene oxide contains the aggregate of graphene plates and has a conductivity of approximately $10^1$ to $10^2$ S/cm in the film plane direction. Therefore, the graphene sheet prepared using the CVD process or the graphene oxide cannot singly exhibit an electrical conductivity sufficient for use in a transparent electrode.

The metal wiring 15 has a high electrical conductivity. When the metal wiring 15 is formed on the graphene sheet 12, the stacked electrode 10 can have a sufficient conductivity in the film plane direction. Such a multi-layered graphene structure is known to have a relatively high resistance between graphene layers in the film thickness direction. When the multi-layered graphene film 14 has a remarkably small thickness (a small number of graphene layers), its resistance is not very high in the film thickness direction. As the number of the graphene layers in the multi-layered graphene film 14 increases, the light transmittance is lowered. Thus, it is undesirable that the number of the graphene sheets 13 is excessively increased. When the multi-layered graphene film 14 has a thickness of 5 nm or less, the stacked electrode of the embodiment has excellent electrical conductivity and transmittance and thereby can be used as a transparent electrode for a display device, a solar cell, or the like. The thickness is further preferably 0.6 to 2 nm. When the thickness is 2 nm or less, the multi-layered graphene film 14 can have an increased transparency. When the thickness is less than 0.6 nm, the multi-layered graphene film 14 has a single-layer portion and a bi-layer portion, and it is difficult to form a uniform structure.

The graphene plate 11 of the embodiment may contain an unsubstituted or substituted graphene. It is preferred that carbon atoms in the graphene plate are partially substituted by nitrogen (N) or boron (B) atoms for the following reasons. Such a substituent atom can be coordinated with a metal in a wiring material to strengthen the connection between the graphene and the metal material. Furthermore, the substituent atom can facilitate the electron transfer to lower the interface electrical resistance between the graphene plate (the graphene sheet) and the wiring material. In addition, the substituent atom has an effect of preventing oxidation of the easily oxidizable wiring material. When the carbon atoms are partially substituted by the nitrogen atoms, the resultant graphene plate has a work function lower than that of an unsubstituted graphene plate and therefore can be suitably used in a negative electrode. When the carbon atoms are partially substituted by the boron atoms, the resultant graphene plate has a work function higher than that of an unsubstituted graphene plate and therefore can be suitably used in a positive electrode.

When the carbon atoms in the graphene plate are partially substituted by the nitrogen atoms, the number ratio of the nitrogen atoms to the carbon atoms is preferably 1/1000 to 1/5. The substituent nitrogen atoms may be in the form of pyridine, pyrrole/pyridone, N-oxide, quaternary nitrogen, or the like.

When a nitrogen atom is contained in the graphene, it is possible to strengthen the connection between the graphene and the metal nanowires. In particular, pyridine nitrogen is particularly preferred.

When the carbon atoms in the graphene plate are partially substituted by the boron atoms, the number ratio of the boron atoms to the carbon atoms is preferably 1/1000 to 1/5. The substituent boron atoms may be in the form of boron-oxygen, boron-nitrogen, boron-substituted graphite skeleton, boron-boron, or the like.

Figure 3:
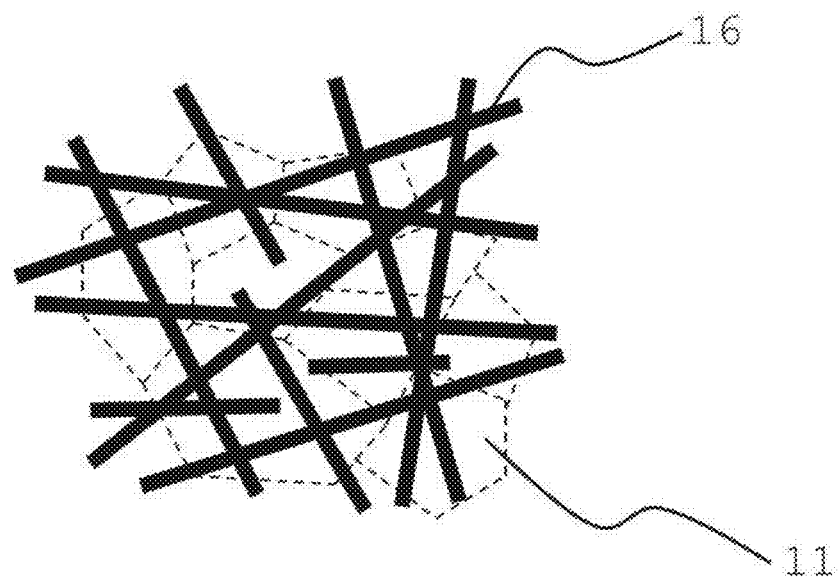
FIG. 3 is a conceptual top view of the stacked electrode of the embodiment.

As shown in the conceptual top view of FIG. 3, the metal wiring 15 of the embodiment is formed on the graphene plates 11. The metal wiring 15 is discontinuously provided on the graphene sheet 12 in FIG. 1. The metal wiring 15 contains randomly oriented metal nanowires 16. The metal wiring 15 may be formed on a surface of the graphene sheet 12 at an appropriate ratio in view of the wiring density, transmittance, and electrical conductivity. The metal wiring 15 may further contain a nanowire protecting polymer or a conductive aid as long as the transmittance of the metal wiring 15 is not adversely affected by the agent. The randomly oriented metal nanowires 16 have a mesh structure and an excellent light transmittance. The metal nanowires 16 are electrically connected to the graphene plates 11 in the graphene sheet 12. The metal nanowires 16 partially overlap with each other to form a metal nanowire layer.

The metal nanowires 16 preferably have a diameter of 20 nm or more to obtain a desired length. In view of the electrical conductivity and the mesh structure, the average diameter of the metal nanowires 16 is preferably 20 to 200 nm, more preferably 30 to 150 nm, further preferably 50 to 120 nm. For example, the diameter of the metal nanowires 16 can be measured by observation using a scanning electron microscope (SEM), a transmission electron microscope (TEM), or an atomic force microscope (AFM).

The average length of the metal nanowires 16 may be appropriately selected in view of the conductivity and transparency of the resultant electrode. Specifically, the average length is preferably at least 1 μm in view of the conductivity, and is preferably at most 100 μm to avoid transparency deterioration by an aggregation of the metal nanowires 16. The optimum length of the metal nanowires 16 depends on the diameter thereof. The ratio of the length to the diameter (the length/diameter ratio) of the metal nanowires 16 may be approximately 100 to 1000.

The thickness of the metal nanowire layer may be appropriately selected depending on the diameter of the metal nanowires 16, the number of the overlaps, and the like. Specifically, the metal nanowire layer has a thickness of approximately 30 to 300 nm.

The metal nanowires 16 preferably contain silver, gold, or copper. Such a metal has a low electrical resistance of approximately $2 \times 10^{-8}$ Ω/m or less and a relatively high chemical stability, and thereby is preferably used in this embodiment. When the metal nanowires 16 contain 60% by mass or more of this metal, an alloy of palladium, indium, bismuth, zinc, nickel, aluminum, or the like may be used in the metal nanowires 16. The metal nanowires 16 may contain an alloy of silver, gold, or copper.

A polymer layer 17 is exemplified as the nanowire protecting polymer. The metal nanowires 16 exist in the polymer layer 17. The metal nanowires 16 contact with the multi-layered graphene film 14, and the metal nanowires 17 connect electrically with the multi-layered graphene film 14. The polymer layer 17 may include pores which may contact with the multi-layered graphene film 14. The polymer layer 17 includes as little pore as possible. The polymer layer 17 is shown in FIG. 4. Examples of a polymer contained in the polymer layer 17 may include a conductive polymer and a near-infrared transmission polymer. The conductive polymer functions as a leveling agent and also provides conductivity so as to improve the device performance. As the conductive polymer, PEDOT/PSS (poly(3,4-ethylenedioxythiophene)/poly(styrenesulfonic acid)) or a self-doped conductive polymer can be used. The polymer layer 17 preferably contains a graphene oxide.

The stacked electrode 10 of the embodiment is preferably coated with a near-infrared transparent resin. The multi-layered graphene film 14 and the metal wiring 15 have a high near-infrared transparency. Thus, when the stacked electrode 10 is coated with the near-infrared transparent resin, the resultant near-infrared transparent conductive film can be used for producing a solar cell or optical sensor capable of efficiently utilize a near-infrared light. The near-infrared transparent resin is preferably such an amorphous resin that a hydrogen atom on its main carbon chain is substituted by a fluorine atom. For example, the near-infrared transparent resin may be CYTOP (available from Asahi Glass Co., Ltd.).

A method for producing the stacked electrode of the embodiment will be described below with reference to schematic diagrams in FIG. 4.

Figure 4A:
FIGS. 4A to 4H are schematic diagrams of the stacked electrode of the embodiment.
Figure 4B:
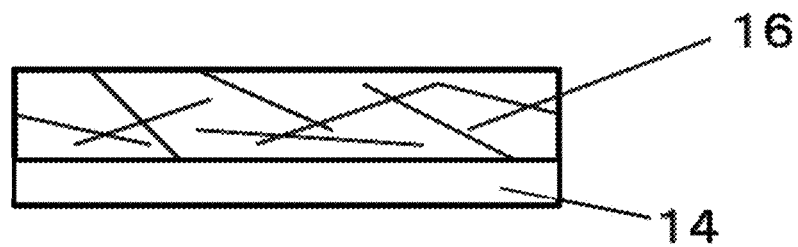
Figure 4C:
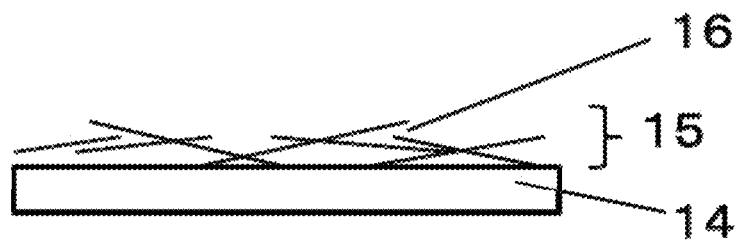
Figure 4D:
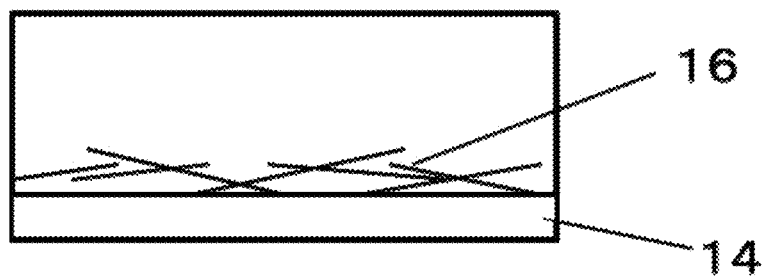
Figure 4E:
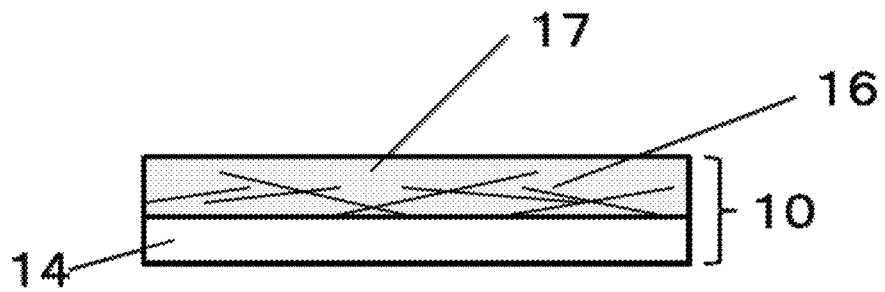

The method for producing the stacked electrode 10 of the embodiment shown in the conceptual view of FIG. 1 contains preparing the multi-layered graphene film 14 as shown in FIG. 4A, applying a dispersion liquid of the metal nanowires 16 onto the multi-layered graphene film 14 as shown in FIG. 4B, and removing a dispersion medium from the applied dispersion liquid to form the metal wiring 15 as shown in FIG. 4C. It is more preferred that the producing method further includes applying a polymer solution onto the multi-layered graphene film 14 and the metal wiring 15 as shown in FIG. 4D and removing a solvent from the polymer solution to form the polymer layer 17 as shown in FIG. 4E after the removing of the dispersion medium shown in the schematic diagram of FIG. 4C. The metal wiring 15 may be formed by applying the dispersion liquid of the metal nanowires 16 to a support such as a transparent substrate and by transferring the applied metal nanowires 16 onto the multi-layered graphene film 14. Alternatively, the metal wiring 15 may be formed on a single-layer graphene, and then the multi-layered graphene film 14 may be formed from the single-layer graphene.

Figure 4F:
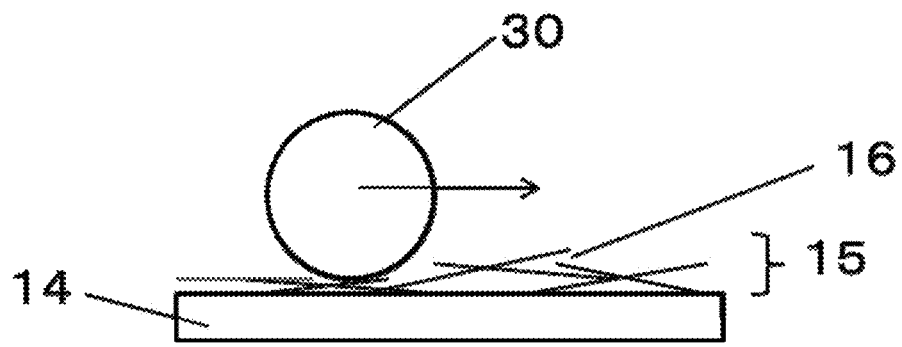

When the metal nanowires 16 are formed by coating and then are subjected to pressing as shown in FIG. 4F (roller pressing 30 in the drawing), it is possible to reduce asperities of the metal nanowires and to strengthen the connection between the multi-layered graphene film and the metal nanowires. The pressing may be performed at the room temperature, but is preferably performed by heating the metal nanowires at a temperature of 80° C. to 120° C. As pressing, planar pressing, roller pressing, and the like are known, but the roller pressing is preferred from the viewpoint of mass productivity. In a case where the pressing treatment is performed on the metal nanowires 16, the pressing treatment is preferably performed after the removing of the dispersion medium from the dispersion liquid of the metal nanowires 16 to form the metal wiring 15, or between the removing of the dispersion medium from the dispersion liquid of the metal nanowires 16 to form the metal wiring 15 and the preparing of a laminate obtained by stacking, on the substrate 20, the multi-layered graphene film 14 and the metal wiring 15 in which the metal nanowires 16 are included in the polymer layer 17.

Figure 4G:
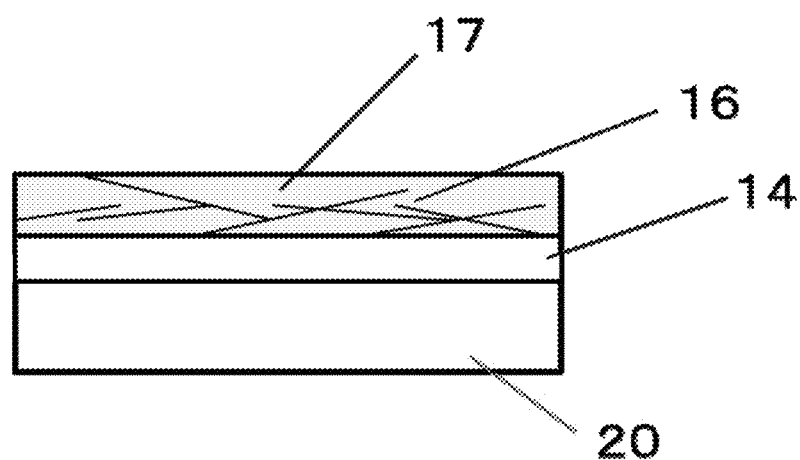
Figure 4H:
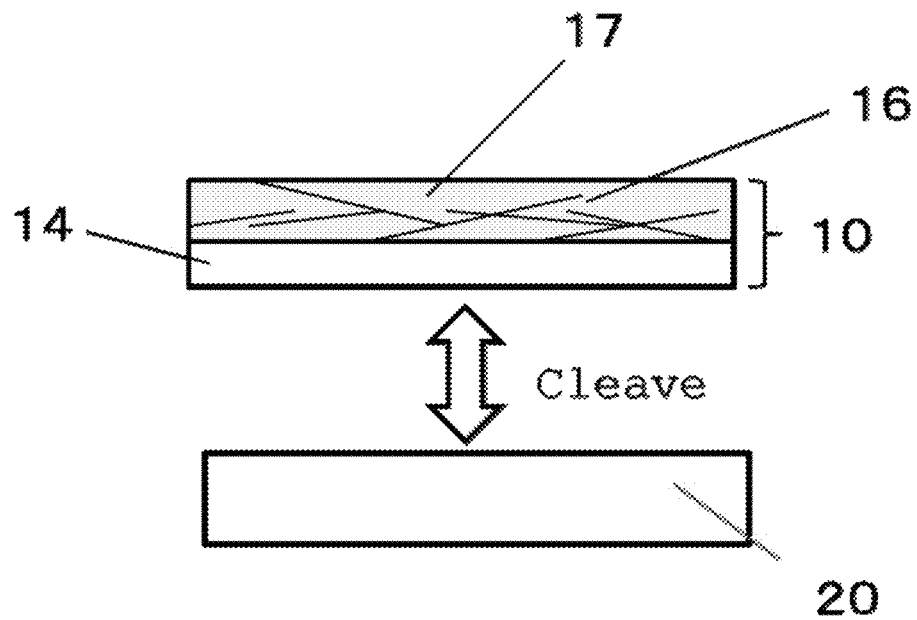

The producing method of the embodiment includes preparing a laminate obtained by stacking, on the substrate 20, the multi-layered graphene film 14 and the metal wiring 15 in which the metal nanowires 16 are included in the polymer layer 17 as shown in FIG. 4A, and peeling and removing, from the substrate 20, the laminate prepared by stacking the multi-layered graphene film 14 and the metal wiring 15 in which the metal nanowires 16 are included in the polymer layer 17 (as shown in FIGS. 4G and 4H). A stacked electrode that is the laminate prepared by stacking the multi-layered graphene film 14 and the metal wiring 15 in which the metal nanowires 16 are included in the polymer layer 17 may be obtained by the above-described producing method.

Each single-layer graphene in the multi-layered graphene film 14 may be prepared by applying and reducing a graphene oxide. Thus, the stacked electrode can be produced without vacuum processes with a large area and a low cost, and can be suitably used for a solar cell or the like.

In another method for preparing the single-layer graphene in the multi-layered graphene film 14, a graphene layer is preferably prepared by a CVD process using a carbon source. The graphene layer prepared by the process has a reduced number of defects, and therefore can be suitably used for a high-definition display or the like.

For example, an unsubstituted single-layer graphene may be prepared by a CVD process using a mixed reactant gas containing methane, hydrogen, and argon on a catalyst underlayer of a Cu foil. It is preferred that a surface of the Cu foil is annealed by a laser irradiation heating treatment before the CVD process to increase the crystal grain size.

For example, a single-layer graphene, in which the carbon atoms are partially substituted by nitrogen atoms, may be prepared by a chemical vapor deposition (CVD) process using a mixed reactant gas containing ammonia, methane, hydrogen, and argon on a catalyst underlayer of a Cu foil. The resultant graphene may be subjected to a heating treatment in a mixed flow of ammonia and argon and then cooled in an argon flow.

In the preparation of the partially nitrogen-substituted single-layer graphene, a low-molecular nitrogen compound such as pyridine, methylamine, ethylenediamine, or urea may be used as a material for the CVD process instead of the ammonia gas, and ethylene, acetylene, methanol, ethanol, or the like may be used as the carbon source instead of the methane.

The multi-layered graphene film 14 may be prepared by transferring the single-phase graphene onto a transfer film and by stacking the single-phase graphenes. Thus, the transfer film is press-bonded to the prepared single-layer graphene, and the single-layer graphene is peeled off from the underlayer, for example, by immersing in an ammonia-alkaline cupric chloride etchant. Then, the single-layer graphene is transferred from the transfer film to a desired substrate. The multi-layered graphene film 14 can be prepared by repeating these steps to stack the single-layer graphenes.

The graphene used in the transferring step may be formed not by the CVD process but by using the graphene oxide. Thus, the graphene may be formed by spin-coating a metal such as Cu with a thin film of a water dispersion liquid containing the graphene oxide and by subjecting the thin film to a heating nitrogen substitution treatment in an atmosphere of a mixture of ammonia, hydrogen, and argon. The graphene used in the transferring step may be formed by subjecting a thin graphene oxide film to a hydrazine treatment under heating and by drying the treated film. The graphene may be formed by treating a thin unsubstituted graphene film with a nitrogen plasma. Alternatively, the graphene used in the transferring step may be formed by applying a microwave onto Cu, thereby generating a plasma for preparing a thin nitrogen-substituted graphene film, in an atmosphere of a mixture of ammonia, methane, hydrogen, and argon. In addition, the graphene may be electrochemically reduced in a supporting electrolyte solution. The supporting electrolyte is most preferably a quaternary ammonium salt or a quaternary phosphonium salt. In this case, the graphene is doped with a reductant (an electron) and a counter cation (a quaternary ammonium ion or a quaternary phosphonium ion).

A partially boron-substituted single-layer graphene can be prepared in the same manner using a mixed reactant gas containing diborane, methane, hydrogen, and argon.

The layer number of the multi-layered graphene film 14 can be measured using a high-resolution TEM (transmission electron microscope). The area of the graphene plate 11 can be measured by observing the grain boundary using a TEM, an SEM, an AFM, or a low energy electron microscope (LEEM).

For example, the metal wiring 15 of the embodiment may be formed on the multi-layered graphene film 14 or a transparent substrate from a dispersion liquid containing the metal nanowires 16.

The dispersion liquid of the metal nanowires 16 may be applied to a surface of the multi-layered graphene film 14 or the transparent substrate to form an applied film by a spin coating method, a bar coating method, an ink-jet printing method, or the like. For example, a network structure of the metal nanowires 16 may be formed by drying the applied film in a nitrogen or argon flow at approximately 50° C. to 100° C. for about 0.5 to 2 hours to remove the dispersion medium. The thickness of the network structure can be controlled at a desired value by repeating the steps of applying and drying the dispersion liquid.

The multi-layered graphene film 14 has a high tolerance to various solvents, and is not degraded by the dispersion medium for the metal nanowires 16. The multi-layered graphene film 14 also functions as a protecting film for underlayer. The metal wiring 15 can be bonded to the multi-layered graphene film 14 easily, uniformly, and rigidly by spreading the metal nanowires 16 directly on the multi-layered graphene film 14.

In view of stably dispersing the metal nanowires 16 in the dispersion medium, the metal nanowires 16 preferably have a diameter of 200 nm or less. When the metal nanowires 16 have a diameter of more than 200 nm, the dispersion of the metal nanowires 16 in the dispersion medium is deteriorated, and the applied film cannot be uniformly formed easily. On the other hand, when the metal nanowires 16 have a diameter of less than 20 nm, the metal nanowires 16 tend to have a small length, and the applied film has a high surface resistance. The diameter is further preferably 30 to 150 nm.

For example, a silver nanowire having a predetermined diameter and the like is available from Seashell Technology. Alternatively, the silver nanowire having a predetermined diameter and the like may be prepared in accordance with Liangbing Hu, et al., ACS Nano, vol. 4, no. 5, page 2955 (2010). For example, a copper nanowire having a predetermined diameter and the like may be prepared in accordance with Japanese Patent Application Laid-Open (JP-A) No. 2004-263318 or 2002-266007.

The dispersion medium, in which the metal nanowires 16 are dispersed, is not particularly limited, as long as the medium does not oxidize the metal and can be readily removed by drying. The dispersion medium may be water, methanol, ethanol, isopropanol, or the like. The concentration of the metal nanowires 16 in the dispersion liquid is not particularly limited and is appropriately selected in view of achieving an excellent dispersion state. The density of the metal nanowires 16 per a unit area of the stacked electrode 10 can be controlled by changing the area and amount of the metal nanowires 16 to be applied.

The very thin metal film may be inserted between the graphene layer and the metal nanowire layer. The metal film is prepared by vacuum deposition of metal or by casting metal nanoparticles or precursor compounds of the metal.

In the case of using a glass substrate as the transparent substrate, it is preferred that a surface of the glass substrate (on which the applied film is to be formed) is subjected to a hydrophilization treatment. For example, the hydrophilization treatment may be a nitrogen plasma treatment. Specifically, in the nitrogen plasma treatment, the glass substrate may be left for 10 minutes in a nitrogen plasma (0.1 millibar) in a magnetron sputtering apparatus (13.56 MHz, 150 W). The applied film can be uniformly formed when the hydrophilicity of a surface of the glass substrate is increased. Alternatively, a surface of a quartz substrate may be treated with 3-aminoethyltriethoxysilane to firmly connect the substrate to the metal nanowires 16.

Since the applied film of the metal nanowires 16 has large asperities, it is difficult to level the surface of the applied film. However, when the multi-layered graphene film 14 is prepared on the flat substrate 20, the metal nanowire layer 16 is prepared thereon, a polymer is applied onto the metal nanowire layer 16 to fill the asperities of the metal nanowire layer with the polymer, and then the multi-layered graphene film is peeled and removed from the substrate, the multi-layered graphene surface that is the uppermost layer can be leveled. The leveled stacked electrode is preferably used as an electrode for an OLED or a solar cell.

Figure 5:
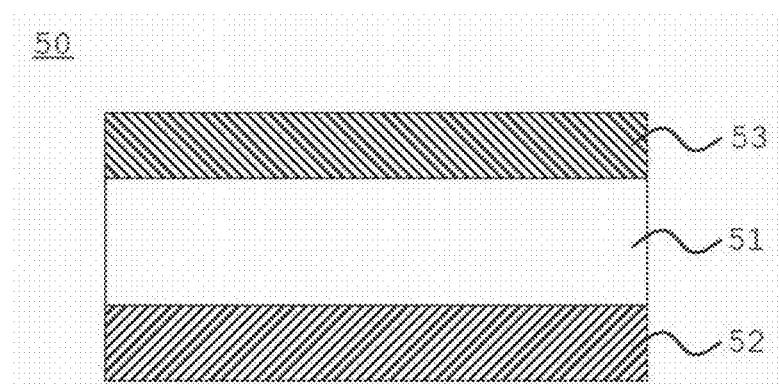
FIG. 5 is a conceptual view of a photoelectric conversion device according to an embodiment.

As shown in FIG. 5, a photoelectric conversion device 50 according to an embodiment has a structure containing a stacking electrode 53 and a counter electrode 52, and a photoelectric conversion layer 51 interposed between the counter electrode 52 and the stacking electrode 53. Among the two electrodes 52 and 53, at least the stacking electrode 53 is the above-described stacked electrode. For example, the photoelectric conversion device 50 can be produced by transferring the stacked electrode onto a solar cell substrate, an organic EL substrate, or the like.

As shown in FIGS. 6A to 6I, a method for producing the photoelectric conversion device 50 is a method for producing the photoelectric conversion device 50 including at least two electrodes and the photoelectric conversion layer 51 interposed between the electrodes as constituents, and at least one of the electrodes is produced by the above-described method.

Regarding the photoelectric conversion device 50 according to the embodiment can be produced by coating. Further, the electrode can be dry-laminated on the upper portion of the photoelectric conversion layer 51.

Figure 6A:
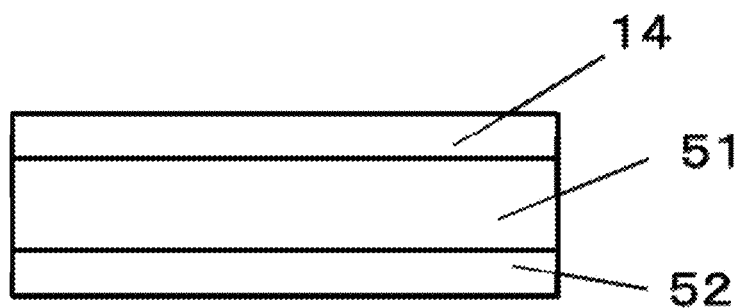
FIGS. 6A to 6I are schematic diagrams of the stacked electrode of the embodiment.
Figure 6B:
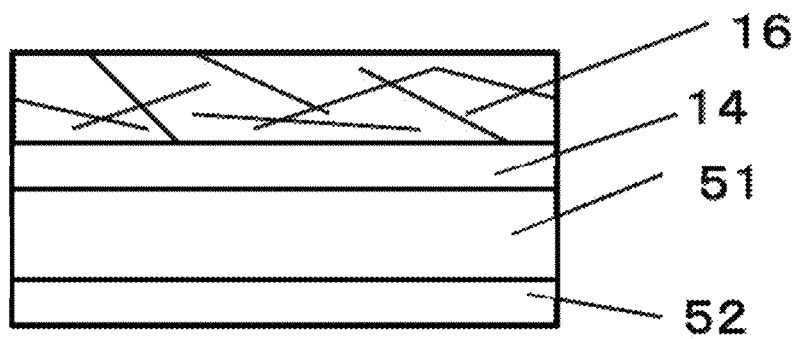
Figure 6C:
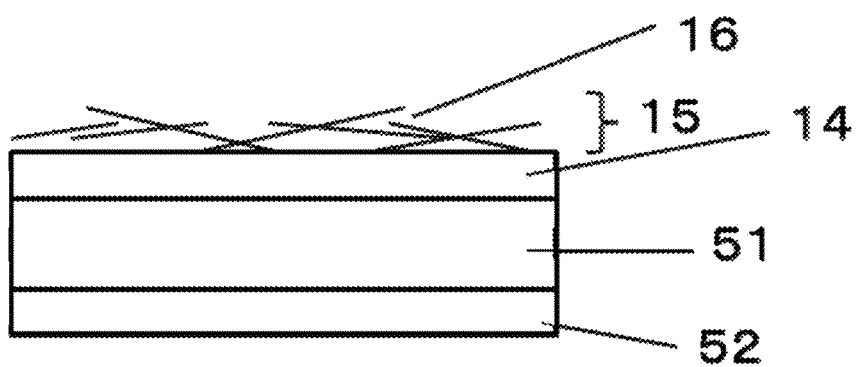

The producing method includes preparing the multi-layered graphene film 14 on the photoelectric conversion layer 51 formed on the counter electrode 52 as shown in the schematic diagram of FIG. 6A, applying the dispersion liquid of the metal nanowires 16 onto the multi-layered graphene film 14 as shown in FIG. 6B, and removing the solvent from the dispersion liquid to form the metal wiring 15 as shown in FIG. 6C.

As the counter electrode 52, an ITO glass, an ITO film, a stacked film of an ITO/a silver alloy, a metal foil, or the like can be used.

The forming of the photoelectric conversion layer 51 on the counter electrode 52 is preferably performed by coating.

Figure 6D:
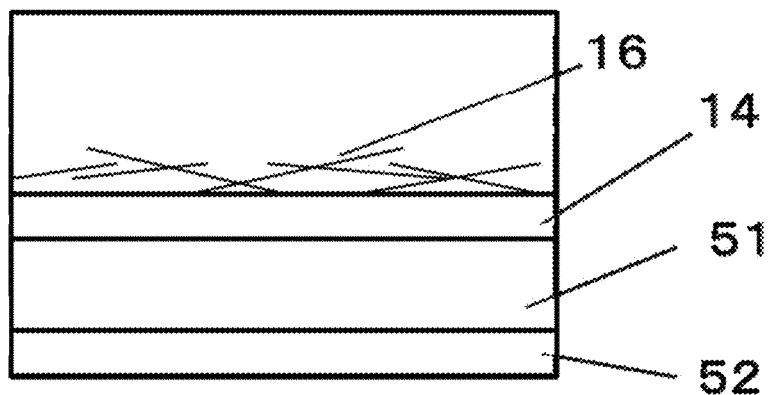
Figure 6E:
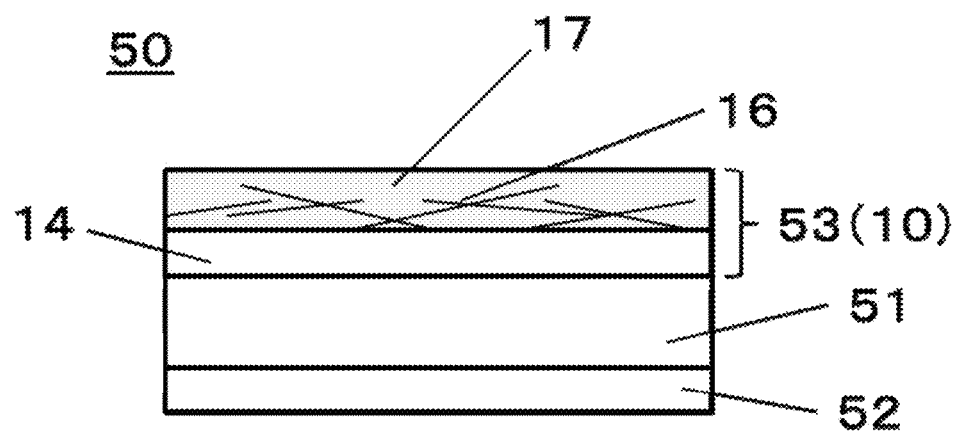

The producing method may include applying a polymer solution onto the multi-layered graphene film 14 and the metal wiring 15 shown in the conceptual view of FIG. 6D and removing a solvent from the polymer solution to prepare the polymer layer 17 shown in the conceptual view of FIG. 6E.

Figure 6F:
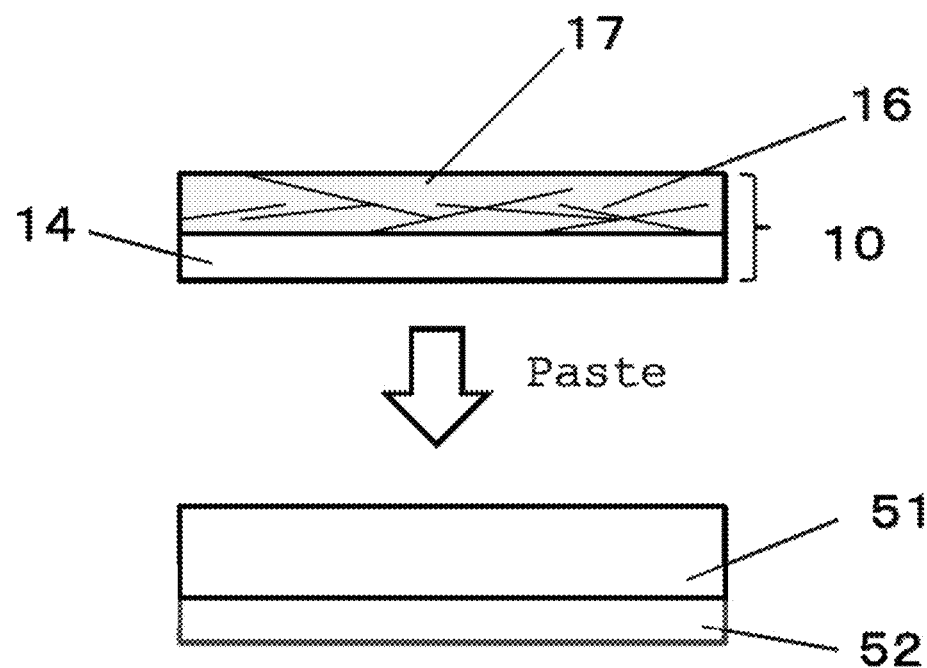

The photoelectric conversion device 50 may be prepared as shown in the schematic diagram of FIG. 6E in such a manner that the stacked electrode 10 is pasted to the upper portion of the photoelectric conversion layer 51 as shown in the schematic diagram of FIG. 6F. In this case, a dry lamination is preferably used. It is more preferred that the pasting of the stacked electrode to the upper portion of the photoelectric conversion layer is performed by a roller lamination under dry atmospheric pressure. It is more preferred that humidity is controlled, and relative humidity of 0 to 20% is preferred.

Figure 6G:
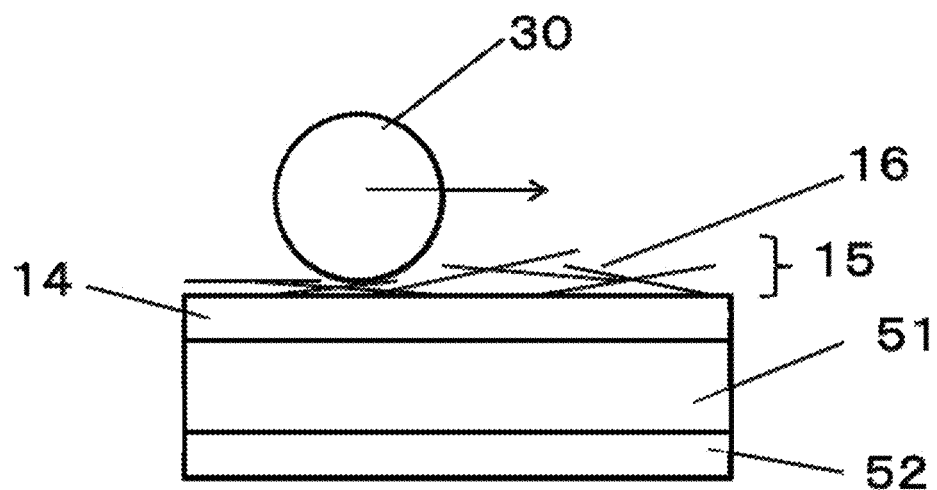
Figure 6H:
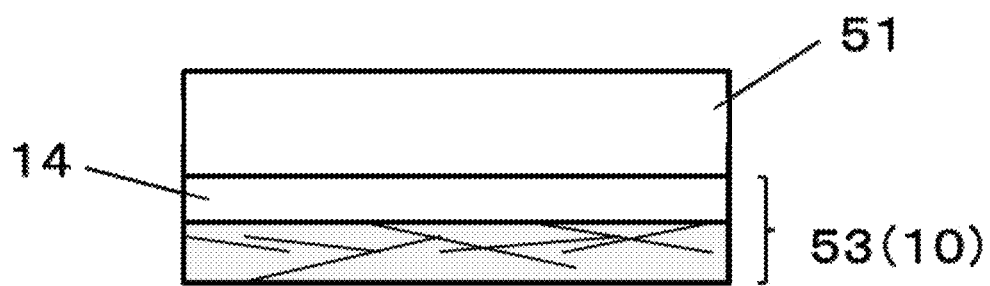
Figure 6I:
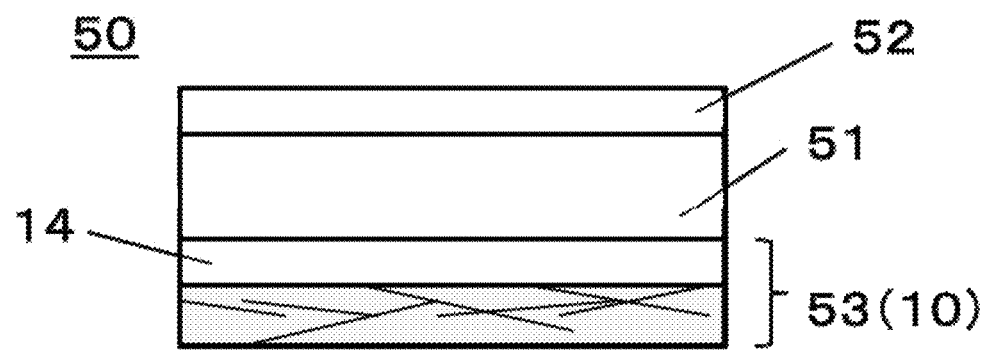

As shown in the schematic diagram of FIG. 6G, the metal wiring 15 may be subjected to pressing. Further, after the photoelectric conversion layer 51 is prepared on the multi-layered graphene film 14 of the stacked electrode 10 as shown in FIG. 6H, the counter electrode 52 may be prepared as shown in FIG. 6I. The counter electrode can be prepared by the stacked electrode 10, an ITO film, a stacked film of an ITO/a silver alloy, a laminate of a metal foil, or vapor deposition or sputtering of a metal.

Several specific examples will be described below.

Example 1

A graphene oxide is synthesized in accordance with a literature (W. S. Hummers, et al., J. Am. Chem. Soc., 1958, vol. 80, page 149) using a graphite having an average particle diameter of approximately 4 µm (manufactured by Ito Graphite Co., Ltd.) as a starting material. An ammonia-containing water dispersion liquid of the graphene oxide is dropped and dried on a hydrophilic glass. The graphene oxide is reacted with a hydrated hydrazine vapor at 80° C. for 1 hour in a hydrazine treatment. Thus-obtained graphene plates have an average area of 0.25±0.04 µm$^2$. The hydrazine-treated graphene oxide is coated with a dispersion liquid of silver nanowires having an average diameter of 110±10 nm (manufactured by Seashell Technology) and then dried in an argon flow at 60° C. for 1 hour. The area ratio of the silver nanowires is 0.30±0.04 in a 4-µm square of the obtained electrode. The silver nanowires are coated with CYTOP (manufactured by Asahi Glass Co., Ltd.) by using an applicator, the resultant is dried, the above hydrophilic glass is peeled and removed in water, and the residue is dried to obtain a stacked electrode.

The obtained stacked electrode has a surface resistance of 3 Ω/sq. (in the plane direction), a total 550-nm-wavelength light transmittance of 65%, and a total 1500-nm-wavelength light transmittance of 69%.

A 50-nm-thick film of a complex of poly(3,4-ethylenedioxythiophene)/poly(styrenesulfonic acid) (PEDOT/PSS) is applied as a hole injection layer by a spin coating method onto an ITO substrate. A solution of a mixture of an n-type semiconductor of (6,6')-phenyl-C61-butyric acid methyl ester (PCBM) and a p-type polymer semiconductor of poly(3-hexylthiophene) (P3HT) is applied thereto by a spin coating method to form a photoelectric conversion layer having a thickness of 120 nm. A 10-nm-thick thin film of fine TiO$_2$ particles is applied as a hole blocking layer thereon. Then, the above stacked electrode is laminate-pressed onto the hole blocking layer under a reduced pressure at 80° C. to obtain an organic thin-film solar cell device. The edges of the layers are sealed by an epoxy resin. Thus-obtained solar cell device exhibits a power generation efficiency of 3.0% or more at the room temperature under a simulated AM1.5 solar light irradiation through the stacked electrode.

Example 2

An organic thin-film solar cell device is produced in the same manner as Example 1 except that the application amount of the silver nanowires is reduced. The area ratio of the silver nanowires is 0.1±0.02 in a 4-µm square of the electrode. The silver nanowires are coated with CYTOP (manufactured by Asahi Glass Co., Ltd.) by using an applicator, the resultant is dried, the hydrophilic glass is peeled and removed in water, and the residue is dried to obtain a stacked electrode.

The obtained stacked electrode has a surface resistance of 50 Ω/sq. (in the plane direction) and a total 550-nm-wavelength light transmittance of 87%. The solar cell device exhibits a power generation efficiency of 3.0% or more at the room temperature under a simulated AM1.5 solar light irradiation through the stacked electrode.

Example 3

A graphene oxide is synthesized in accordance with a literature (W. S. Hummers, et al., J. Am. Chem. Soc., 1958, vol. 80, page 149) using a graphite having an average particle diameter of approximately 4 µm (manufactured by Ito Graphite Co., Ltd.) as a starting material. The particle size of the graphene oxide is reduced by an ultrasonic treatment. An ammonia-containing water dispersion liquid of the graphene oxide is dropped and dried on a hydrophilic glass. The graphene oxide is reacted with a hydrated hydrazine vapor at 80° C. for 1 hour in a hydrazine treatment. Thus-obtained graphene plates have an average area of 0.04±0.01 µm$^2$. The hydrazine-treated graphene oxide is coated with a dispersion liquid of silver nanowires having an average diameter of 60±5 nm (manufactured by Seashell Technology) and then dried in an argon flow at 60° C. for 1 hour. The area ratio of the silver nanowires is 0.30±0.04 in a 4-µm square of the obtained electrode. The hydrazine-treated graphene oxide is coated with a dispersion liquid of silver nanowires having an average diameter of 60±5 nm (manufactured by Seashell Technology) and then dried in an argon flow at 60° C. for 1 hour. The silver nanowires are coated with CYTOP (manufactured by Asahi Glass Co., Ltd.) by using an applicator, the resultant is dried, the above hydrophilic glass is peeled and removed in water, and the residue is dried to obtain a stacked electrode. The obtained stacked electrode has a surface resistance of 15 Ω/sq. (in the plane direction) and a total 550-nm-wavelength light transmittance of 67%.

A 50-nm-thick film of a complex of poly(3,4-ethylenedioxythiophene)/poly(styrenesulfonic acid) (PEDOT/PSS) is applied as a hole injection layer by a spin coating method onto an ITO substrate. A solution of a mixture of an n-type semiconductor of (6,6')-phenyl-C61-butyric acid methyl ester (PCBM) and a p-type polymer semiconductor of poly(3-hexylthiophene) (P3HT) is applied thereto by a spin coating method to form a photoelectric conversion layer having a thickness of 120 nm. A 10-nm-thick thin film of fine TiO$_2$ particles is applied as a hole blocking layer thereon. Then, the above stacked electrode is laminate-pressed onto the hole blocking layer under a reduced pressure at 80° C. to obtain an organic thin-film solar cell device. The edges of the layers are sealed by an epoxy resin. Thus-obtained solar cell device exhibits a power generation efficiency of 3.0% or more at the room temperature under a simulated AM1.5 solar light irradiation through the stacked electrode.

Example 4

A single-layer planar graphene, in which carbon atoms are partially substituted by nitrogen atoms, is prepared by a CVD process at 1000° C. for 5 minutes using a mixed reactant gas having ammonia:methane:hydrogen:argon ratio of 15:60:65:200 (ccm) on a catalyst underlayer of a Cu foil. In the CVD process, the graphene is generally prepared in the single-layer form, which may contain a bi- or multi-layer part depending on a preparation condition. The single-layer or multi-layer graphene is treated at 1000° C. for 5 minutes with a mixed flow of ammonia and argon, and then cooled in an argon flow. The surface of the Cu foil is annealed by a laser irradiation heating treatment before the CVD process to increase the crystal grain size. A thermal transfer film is press-bonded to the prepared single-layer or multi-layer graphene, and they are immersed in an ammonia-alkaline cupric chloride etchant to dissolve the Cu. Then, the single-layer or multi-layer graphene is transferred from the thermal transfer film to a PET film. These steps are repeated to stack four single-layer or multi-layer graphene layers on the PET film. Thus-obtained graphene plates have an average area of 0.50±0.04 µm². The graphene layer is coated with a dispersion liquid of silver nanowires having an average diameter of 110±10 nm (manufactured by Seashell Technology) and then dried in an argon flow at 60° C. for 1 hour. The area ratio of the silver nanowires is 0.30±0.04 in a 4-µm square of the obtained electrode. The silver nanowires are coated with CYTOP (manufactured by Asahi Glass Co., Ltd.) by using an applicator, the resultant is dried, the above PET film is peeled and removed in water or in ethanol, and the residue is dried to obtain a stacked electrode.

The obtained stacked electrode has a surface resistance of 3 Ω/sq. (in the plane direction), a total 550-nm-wavelength light transmittance of 65%, and a total 1500-nm-wavelength light transmittance of 69%.

A 50-nm-thick film of a complex of poly(3,4-ethylenedioxythiophene)/poly(styrenesulfonic acid) (PEDOT/PSS) is applied as a hole injection layer by a spin coating method onto an ITO substrate. A solution of a mixture of an n-type semiconductor of (6,6')-phenyl-C61-butyric acid methyl ester (PCBM) and a p-type polymer semiconductor of poly(3-hexylthiophene) (P3HT) is applied thereto by a spin coating method to form a photoelectric conversion layer having a thickness of 120 nm. A 10-nm-thick thin film of fine TiO₂ particles is applied as a hole blocking layer thereon. Then, the above stacked electrode is laminate-pressed onto the hole blocking layer under a reduced pressure at 80° C. to obtain an organic thin-film solar cell device. The edges of the layers are sealed by an epoxy resin. Thus-obtained solar cell device exhibits a power generation efficiency of 3.0% or more at the room temperature under a simulated AM1.5 solar light irradiation through the stacked electrode.

Example 5

An unsubstituted single-layer planar graphene is prepared by a CVD process at 1000° C. for 5 minutes using a mixed reactant gas having a ammonia:methane:hydrogen:argon ratio of 15:60:65:200 (ccm) on a catalyst underlayer of a Cu foil. In the CVD process, the graphene is generally prepared in the single-layer form, which may contain a bi- or multi-layer part depending on a preparation condition. The single-layer or multi-layer graphene is treated at 1000° C. for 5 minutes with an argon mixture flow, and then cooled in an argon flow. The surface of the Cu foil is annealed by a laser irradiation heating treatment before the CVD process to increase the crystal grain size. A thermal transfer film is press-bonded to the prepared single-layer or multi-layer graphene, and they are immersed in an ammonia-alkaline cupric chloride etchant to dissolve the Cu. Then, the single-layer or multi-layer graphene is transferred from the thermal transfer film to a PET film. These steps are repeated to stack four single-layer or multi-layer graphene layers on the PET film. The stack is immersed in a nitric acid solution to perform p-type doping. Thus-obtained graphene plates have an average area of 0.40±0.04 µm². The graphene layer is coated with a dispersion liquid of silver nanowires having an average diameter of 110±10 nm (manufactured by Seashell Technology) and then dried in an argon flow at 60° C. for 1 hour. The area ratio of the silver nanowires is 0.30±0.04 in a 4-µm square of the obtained electrode. The silver nanowires are coated with CYTOP (manufactured by Asahi Glass Co., Ltd.) by using an applicator, the resultant is dried, the above PET film is peeled and removed in water or in ethanol, and the residue is dried to obtain a stacked electrode.

The obtained stacked electrode has a surface resistance of 3 Ω/sq. (in the plane direction), a total 550-nm-wavelength light transmittance of 64%, and a total 1500-nm-wavelength light transmittance of 68%.

A 50-nm-thick film of a complex of poly(3,4-ethylenedioxythiophene)/poly(styrenesulfonic acid) (PEDOT/PSS) is applied as a hole injection layer by a spin coating method onto the stacked electrode. A solution of a mixture of an n-type semiconductor of (6,6')-phenyl-C61-butyric acid methyl ester (PCBM) and a p-type polymer semiconductor of poly(3-hexylthiophene) (P3HT) is applied thereto by a spin coating method to form a photoelectric conversion layer having a thickness of 120 nm. A 10-nm-thick thin film of fine TiO₂ particles is applied as a hole blocking layer thereon. Then, Ca metal is vapor-deposited on the hole blocking layer, and the outer surface and the edges of the layers are sealed by an epoxy resin. Thus-obtained organic thin-film solar cell device exhibits a power generation efficiency of 3.0% or more at the room temperature under a simulated AM1.5 solar light irradiation through the stacked electrode.

Example 6

A graphene oxide is synthesized in accordance with a literature (W. S. Hummers, et al., J. Am. Chem. Soc., 1958, vol. 80, page 149) using a graphite having an average particle diameter of approximately 4 µm (manufactured by Ito Graphite Co., Ltd.) as a starting material. An ammonia-containing water dispersion liquid of the graphene oxide is dropped and dried on a hydrophilic glass. The graphene oxide is reacted with a hydrated hydrazine vapor at 80° C. for 1 hour in a hydrazine treatment. A methanol dispersion liquid of copper nanowires having an average diameter of 90±10 nm is used. Thus-obtained graphene plates have an average area of 0.25±0.04 µm². A methanol dispersion liquid of copper nanowires having an average diameter of 90±10 nm is used. The copper nanowires are prepared in accordance with JP-A No. 2004-263318. The hydrazine-treated graphene oxide is coated with the copper nanowires and then dried in an argon flow at 60° C. for 1 hour. The area ratio of the copper nanowires is 0.25±0.04 in a 4-µm square of the obtained electrode. The copper nanowires are coated with PMMA by using an applicator, the resultant is dried, the above hydrophilic glass is peeled and removed in water, and the residue is dried to obtain a stacked electrode.

The obtained stacked electrode has a surface resistance of 10 Ω/sq. (in the plane direction) and a total 550-nm-wavelength light transmittance of 70%.

A 50-nm-thick film of a complex of poly(3,4-ethylenedioxythiophene)/poly(styrenesulfonic acid) (PEDOT/PSS) is applied as a hole injection layer by a spin coating method onto an ITO substrate. A solution of a mixture of an n-type semiconductor of (6,6')-phenyl-C61-butyric acid methyl ester (PCBM) and a p-type polymer semiconductor of poly(3-hexylthiophene) (P3HT) is applied thereto by a spin coating method to form a photoelectric conversion layer having a thickness of 120 nm. A 10-nm-thick thin film of fine TiO$_2$ particles is applied as a hole blocking layer thereon. Then, the above stacked electrode is laminate-pressed onto the hole blocking layer under a reduced pressure at 80° C. to obtain an organic thin-film solar cell device. The edges of the layers are sealed by an epoxy resin. Thus-obtained solar cell device exhibits a power generation efficiency of 3.0% or more at the room temperature under a simulated AM1.5 solar light irradiation through the stacked electrode.

Example 7

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is dropped and dried on a hydrophilic glass. The graphene oxide is reacted with a hydrated hydrazine vapor at 80° C. for 1 hour in a hydrazine treatment. Thus-obtained graphene plates have an average area of 0.25±0.04 μm$^2$. A water dispersion liquid of gold nanowires having an average diameter of 30±3 nm (manufactured by Sigma-Aldrich) is used. The hydrazine-treated graphene oxide is coated with the gold nanowires and then dried in an argon flow at 150° C. for 1 hour. The area ratio of the gold nanowires is 0.1±0.02 in a 4-μm square of the obtained electrode. The gold nanowires are coated with PMMA by using an applicator, the resultant is dried, the above hydrophilic glass is peeled and removed in water, and the residue is dried to obtain a stacked electrode.

The obtained stacked electrode has a surface resistance of 20 Ω/sq. (in the plane direction) and a total 550-nm-wavelength light transmittance of 85%.

A 50-nm-thick film of a complex of poly(3,4-ethylenedioxythiophene)/poly(styrenesulfonic acid) (PEDOT/PSS) is applied as a hole injection layer by a spin coating method onto an ITO substrate. A solution of a mixture of an n-type semiconductor of (6,6')-phenyl-C61-butyric acid methyl ester (PCBM) and a p-type polymer semiconductor of poly(3-hexylthiophene) (P3HT) is applied thereto by a spin coating method to form a photoelectric conversion layer having a thickness of 120 nm. A 10-nm-thick thin film of fine TiO$_2$ particles is applied as a hole blocking layer thereon. Then, the above stacked electrode is laminate-pressed onto the hole blocking layer under a reduced pressure at 80° C. to obtain an organic thin-film solar cell device. The edges of the layers are sealed by an epoxy resin. Thus-obtained solar cell device exhibits a power generation efficiency of 3.0% or more at the room temperature under a simulated AM1.5 solar light irradiation through the stacked electrode.

Example 8

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is dropped and dried on a hydrophilic glass. The graphene oxide is reacted with a hydrated hydrazine vapor at 80° C. for 1 hour in a hydrazine treatment. Thus-obtained graphene plates have an average area of 0.25±0.04 μm$^2$. The hydrazine-treated graphene oxide is coated with a dispersion liquid of silver nanowires having an average diameter of 110±10 nm (manufactured by Seashell Technology) and then dried in an argon flow at 60° C. for 1 hour. The area ratio of the silver nanowires is 0.30±0.04 in a 4-μm square of the obtained electrode. The silver nanowires are coated with PMMA by using an applicator, the resultant is dried, the above hydrophilic glass is peeled and removed in water, and the residue is dried to obtain a stacked electrode.

The obtained stacked electrode has a surface resistance of 3 Ω/sq. (in the plane direction) and a total 550-nm-wavelength light transmittance of 65%.

A 50-nm-thick film of a complex of poly(3,4-ethylenedioxythiophene)/poly(styrenesulfonic acid) (PEDOT/PSS) is applied as a hole injection layer by a spin coating method onto an ITO electrode formed on a PET film. A p-type organic semiconductor of N,N'-di-1-naphthyl-N,N'-diphenyl-1,1'-biphenyl-4,4'-diamine (NPD) is vapor-deposited into a thickness of 30 nm on the hole injection layer, tris(8-hydroxyquinoline)aluminum (Alq$_3$) capable of acting as an n-type semiconductor for transferring electrons and of emitting a light is further vapor-deposited into a thickness of 40 nm thereon, and LiF is further vapor-deposited into a thickness of 1.5 nm as an electron injection layer thereon.

Then, the above stacked electrode is laminate-pressed onto the electron injection layer under a reduced pressure at 80° C. to obtain an organic EL device. The edges of the layers are sealed by an epoxy resin.

Furthermore, a roughened surface film is attached to either electrode to improve the light output efficiency.

Thus-obtained organic EL device is transparent, is capable of both-side light emission, has a high light emission efficiency, and is lightweight and flexible.

Example 9

Molybdenum is vapor-deposited on a stainless steel (SUS304) foil. A photoelectric conversion layer of a Cu—Ga film, an In film, a p-type selenide CIGS film, an n-type CdS film, and a ZnO film are formed in this order thereon.

Then, the stacked electrode produced in Example 1 is laminate-pressed onto the ZnO film under a reduced pressure at 80° C. to obtain a compound thin-film solar cell device. The edges of the layers are sealed by an epoxy resin.

The solar cell device of the embodiment has a high energy conversion efficiency, can be relatively easily prevented from being deteriorated in the output by using only a simple sealant without water removing agents and oxygen removing agents, and is lightweight and flexible.

Example 10

Molybdenum is vapor-deposited on a stainless steel (SUS304) foil. A photoelectric conversion layer of a Cu—Ga film, an In film, a p-type selenide CIGS film, an n-type CdS film, and a ZnO film are formed in this order thereon.

An ammonia-containing water dispersion liquid of the graphene oxide obtained in Example 1 is dropped and dried on the ZnO film. Then, the graphene oxide is reacted with a hydrated hydrazine vapor at 80° C. for 1 hour in a hydrazine treatment. The hydrazine-treated graphene oxide is coated with a dispersion liquid of silver nanowires having an average diameter of 110±10 nm (manufactured by Seashell Technology) and then dried in an argon flow at 60° C. for 1 hour. The silver nanowires are spin-coated with the graphene oxide, are further coated with PMMA by using an applicator, and the resultant is dried at 100° C. to obtain a compound thin-film solar cell device. The edges of the layers are sealed by an epoxy resin.

The solar cell device of the embodiment has a high energy conversion efficiency, can be relatively easily prevented from being deteriorated in the output by using only a simple sealant without water removing agents and oxygen removing agents, and is lightweight and flexible.

Example 11

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is spray-coated at 100° C. on a silicone resin film. Next, the graphene oxide is reacted with a hydrated hydrazine vapor at 80° C. for 1 hour in a hydrazine treatment. The hydrazine-treated graphene oxide is coated with a dispersion liquid of silver nanowires having an average diameter of 110±10 nm (manufactured by Seashell Technology) and then dried in an argon flow at 60° C. for 1 hour. A 50-nm-thick film of a complex of poly(3,4-ethylenedioxythiophene)/poly(styrenesulfonic acid) (PEDOT/PSS) is applied by a spin coating method onto the silver nanowires. The silver nanowires are further coated with PMMA by using an applicator, the resultant is dried, and the above silicone resin film is peeled and removed in air to obtain a stacked electrode.

The obtained stacked electrode has a surface resistance of 12/sq. (in the plane direction), and a total 550-nm-wavelength light transmittance of 82%.

A 50-nm-thick film of a complex of poly(3,4-ethylenedioxythiophene)/poly(styrenesulfonic acid) (PEDOT/PSS) is applied as a hole injection layer by a spin coating method onto an ITO substrate. Next, a solution of a mixture of an n-type semiconductor of (6,6')-phenyl-C61-butyric acid methyl ester (PCBM) and a p-type polymer semiconductor of poly(3-hexylthiophene) (P3HT) is applied thereto by a spin coating method to form a photoelectric conversion layer having a thickness of 120 nm. A 10-nm-thick thin film of fine $TiO_2$ particles is applied as a hole blocking layer thereon. Then, the above stacked electrode is laminate-pressed onto the hole blocking layer under a reduced pressure at 80° C. to obtain an organic thin-film solar cell device. The edges of the layers are sealed by an epoxy resin. Thus-obtained solar cell device exhibits a power generation efficiency of 3.0% or more at the room temperature under a simulated AM1.5 solar light irradiation through the stacked electrode.

Example 12

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is spray-coated at 100° C. on a silicone resin film. Next, the graphene oxide is reacted with a hydrated hydrazine vapor at 80° C. for 1 hour in a hydrazine treatment. The hydrazine-treated graphene oxide is coated with a dispersion liquid of silver nanowires having an average diameter of 110±10 nm (manufactured by Seashell Technology) and then dried in an argon flow at 60° C. for 1 hour. Then, the roller pressing is performed at 90° C. thereon, the silver nanowires are coated with an epoxy resin by using an applicator, the resultant is cured by heating and dried, the above silicone resin film is peeled and removed in air to obtain a stacked electrode.

The obtained stacked electrode has a surface resistance of 8 Ω/sq. (in the plane direction), and a total 550-nm-wavelength light transmittance of 80%.

A 50-nm-thick film of a complex of poly(3,4-ethylenedioxythiophene)/poly(styrenesulfonic acid) (PEDOT/PSS) is applied as a hole injection layer by a spin coating method onto the stacked electrode. A solution of a mixture of an n-type semiconductor of (6,6')-phenyl-C61-butyric acid methyl ester (PCBM) and a p-type polymer semiconductor of poly(3-hexylthiophene) (P3HT) is applied thereto by a spin coating method to form a photoelectric conversion layer having a thickness of 120 nm. A 10-nm-thick thin film of fine $TiO_2$ particles is applied as a hole blocking layer thereon. A metal aluminum electrode is vacuum-deposited on the hole blocking layer. The whole device is sealed by a protecting film to obtain an organic thin-film solar cell device. Thus-obtained solar cell device exhibits a power generation efficiency of 3.0% or more at the room temperature under a simulated AM1.5 solar light irradiation through the stacked electrode.

Example 13

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is dropped and dried on a hydrophilic glass. Next, the graphene oxide is reacted with a hydrated hydrazine vapor at 80° C. for 1 hour in a hydrazine treatment. A methanol dispersion liquid of copper nanowires having an average diameter of 90±10 nm is used. The copper nanowires are prepared in accordance with JP-A No. 2004-263318. The hydrazine-treated graphene oxide is coated with the copper nanowires and then dried in an argon flow at 60° C. for 1 hour, and then the roller pressing is performed at 60° C. thereon. The copper nanowires are coated with PMMA by using an applicator, the resultant is dried, the above hydrophilic glass is peeled and removed in water, and the residue is dried in argon to obtain a stacked electrode.

The obtained stacked electrode has a surface resistance of 10 Ω/sq. (in the plane direction), and a total 550-nm-wavelength light transmittance of 70%.

A 50-nm-thick film of a complex of poly(3,4-ethylenedioxythiophene)/poly(styrenesulfonic acid) (PEDOT/PSS) is applied as a hole injection layer by a spin coating method onto a PET substrate having an ITO/silver alloy/ITO-stacked transparent electrode formed thereon. Next, a solution of a p-type polymer semiconductor of poly(3-hexylthiophene) (P3HT) is applied thereto by a spin coating method. Next, a solution of a perovskite material $CH_3NH_3PbI_2Cl$ is applied thereto by a spin coating method to form a photoelectric conversion layer. A 10-nm-thick thin film of fine $TiO_2$ particles is applied as a hole blocking layer thereon. Then, the above stacked electrode is laminate-pressed onto the hole blocking layer under a reduced pressure at 80° C. to obtain a thin-film solar cell device. The edges of the layers are sealed by an epoxy resin. Thus-obtained solar cell device exhibits a power generation efficiency of 5.0% or more at the room temperature under a simulated AM1.5 solar light irradiation through the stacked electrode.

Example 14

A graphene oxide is synthesized in accordance with a literature (W. S. Hummers, et al., J. Am. Chem. Soc., 1958, vol. 80, page 149) using a graphite having an average particle diameter of approximately 4 µm (manufactured by Ito Graphite Co., Ltd.) as a starting material. An ammonia-containing water dispersion liquid of the graphene oxide is spray-coated at 100° C. on a silicone resin film. Next, the graphene oxide is reacted with a hydrated hydrazine vapor at 80° C. for 1 hour in a hydrazine treatment. The hydrazine-treated graphene oxide is coated with a dispersion liquid of silver nanowires having an average diameter of 110±10 nm (manufactured by Seashell Technology) and then dried in an argon flow at 60° C. for 1 hour. Then, the roller pressing is performed at 90° C. thereon, the silver nanowires are coated with an epoxy resin by using an applicator, the resultant is cured by heating and dried, the above silicone resin film is peeled and removed in air to obtain a stacked electrode.

An ammonia-containing water dispersion liquid of the graphene oxide is applied as a protecting buffer layer by a spin coating method onto a PET substrate having an ITO/silver alloy/ITO-stacked transparent electrode formed thereon. Next, the graphene oxide is reacted with a hydrated hydrazine vapor at 80° C. for 1 hour in a hydrazine treatment. A 50-nm-thick film of a complex of poly(3,4-ethylenedioxythiophene)/poly(styrenesulfonic acid) (PEDOT/PSS) is applied as a hole injection layer by a spin coating method onto the PET substrate. Next, a solution of a p-type polymer semiconductor of poly(3-hexylthiophene) (P3HT) is applied thereto by a spin coating method. Next, a solution of a perovskite material $CH_3NH_3PbI_2Cl$ is applied thereto by a spin coating method to form a photoelectric conversion layer. A 10-nm-thick thin film of fine $TiO_2$ particles is applied as a hole blocking layer thereon. Then, the above stacked electrode is laminate-pressed onto the hole blocking layer under a reduced pressure at 80° C. to obtain a thin-film solar cell device. The edges of the layers are sealed by an epoxy resin. Thus-obtained solar cell device exhibits a power generation efficiency of 5.0% or more at the room temperature under a simulated AM1.5 solar light irradiation through the stacked electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for producing a stacked electrode, comprising:
   preparing a multi-layered graphene film directly on an insulating substrate;
   applying a dispersion liquid of metal nanowires directly onto the multi-layered graphene film;
   removing a solvent from the dispersion liquid to prepare a metal wiring on the multi-layered graphene film;
   pressing the metal wiring to prepare a metal wiring on the multi-layered graphene filing and to strengthen the connection between the multi-layered graphene film and the metal nanowires;
   forming a polymer directly on the multi-layered graphene film and the metal wiring to fill asperities of the metal nanowires, wherein the polymer covers the multi-layered graphene film and the metal wiring to obtain a stacked member including the insulating substrate, the multi-layered graphene film, the metal wire, and the polymer; and
   cleaving a side of the stacked member where the multi-layered graphene and the insulating substrate are in direct contact and obtaining the stacked electrode including the multi-layered graphene film, the metal wire, and the polymer.

2. The method according to claim 1, wherein the metal nanowires contain silver, gold, or copper.

3. The method according to claim 1, wherein a thickness of the multi-layered graphene film is between 0.6 nm and 0.5 nm.

4. The method according to claim 1, wherein the preparing of the multi-layered graphene film includes partially substituting carbon atoms of the multi-layered graphene film with nitrogen or boron.

5. The method according to claim 1, wherein the preparing of the multi-layered graphene film includes applying a graphene oxide and reducing the graphene oxide to prepare the multi-layered graphene film on the insulating substrate.

6. The method according to claim 1, wherein the preparing of the multi-layered graphene film includes transferring a graphene formed by a CVD process to prepare the multi-layered graphene film.

7. The method according to claim 1, wherein the polymer is a conductive polymer.

8. The method according to claim 1, wherein the polymer contains a graphene oxide.

9. The method according to claim 1, wherein the polymer is a near-infrared transmission polymer.

10. The method according to claim 1, wherein the insulating substrate is a polymer substrate, a resin substrate or glass.

11. The method according to claim 1, wherein the insulating substrate is a polymer substrate or a resin substrate.

12. The method according to claim 1, wherein the metal wiring formed from the dispersion liquid of the metal nanowires is a plurality of patterned strips, and
   each of the patterned strips includes the metal nanowires.

13. The method according to claim 1, wherein the metal nanowires are randomly oriented, and
   the randomly oriented metal nanowires have a mesh structure.

14. The method according to claim 1, wherein the stacked electrode consists of the multi-layered graphene film, the metal wire, and the polymer.

15. A method for producing a photoelectric conversion device including, as constituents, a stacked electrode, a counter electrode facing the stacked electrode, and a photoelectric conversion layer interposed between the stacked electrode and the counter electrode, wherein
   a method for producing the stacked electrode is the method for producing a stacked electrode comprising:
   preparing a multi-layered graphene film directly on an insulating substrate;
   applying a dispersion liquid of metal nanowires directly onto the multi-layered graphene film;
   removing a solvent from the dispersion liquid to prepare a metal wiring on the multi-layered graphene film;
   pressing the metal wiring to prepare a metal wiring on the multi-layered graphene film and to strengthen the connection between the multi-layered graphene film and the metal nanowires;
   forming a polymer directly on the multi-layered graphene film and the metal wiring to fill asperities of the metal nanowires, wherein the polymer covers the multi-layered graphene film and the metal wiring to obtain a stacked member including the insulating substrate, the multi-layered graphene film, the metal wire, and the polymer, the multi-layered graphene being disposed between the insulating substrate and the metal wiring; and cleaving a side where the multi-layered graphene and the insulating substrate are in direct contact and obtaining the stacked electrode including the multi-layered graphene film, the metal wire, and the polymer.

16. The method according to claim 15, wherein the photoelectric conversion layer is produced by coating.

17. The method according to claim 15, wherein the stacked electrode is pasted to the upper portion of the photoelectric conversion layer by a dry lamination.

18. The method according to claim 15, wherein the photoelectric conversion layer is prepared on the stacked electrode.

19. The method according to claim 15, wherein the counter electrode is an electrode obtained by stacking an ITO and a silver alloy.

20. The method according to claim 15, wherein the counter electrode is a metal foil.

21. The method according to claim 15, wherein the stacked electrode consists of the multi-layered graphene film, the metal wire, and the polymer.

* * * * *